(12) United States Patent
Mohr et al.

(10) Patent No.: US 7,509,543 B2
(45) Date of Patent: Mar. 24, 2009

(54) CIRCUIT AND METHOD FOR ERROR TEST, RECORDATION, AND REPAIR

(75) Inventors: Christian N. Mohr, Plano, TX (US); Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 627 days.

(21) Appl. No.: 10/464,762

(22) Filed: Jun. 17, 2003

(65) Prior Publication Data

US 2004/0261049 A1 Dec. 23, 2004

(51) Int. Cl.
*G11C 29/00* (2006.01)
*G11C 7/00* (2006.01)

(52) U.S. Cl. .................... 714/710; 714/723; 365/201

(58) Field of Classification Search ......... 714/710–711, 714/718–723; 365/200–201
See application file for complete search history.

(56) References Cited

U.S. PATENT DOCUMENTS

| | | | | |
|---|---|---|---|---|
| 5,153,880 A | * | 10/1992 | Owen et al. ................. | 714/710 |
| 5,161,157 A | * | 11/1992 | Owen et al. ................. | 714/710 |
| 5,349,558 A | * | 9/1994 | Cleveland et al. ........... | 365/200 |
| 5,490,042 A | | 2/1996 | Perkins ........................ | 361/778 |
| 5,588,115 A | * | 12/1996 | Augarten ..................... | 714/29 |
| 5,655,105 A | | 8/1997 | McLaury ..................... | 395/496 |
| 5,724,282 A | | 3/1998 | Loughmiller et al. ......... | 365/96 |
| 5,724,366 A | | 3/1998 | Furutani ..................... | 371/21.2 |
| 5,748,543 A | | 5/1998 | Lee et al. .................... | 365/200 |
| 5,795,797 A | * | 8/1998 | Chester et al. ................ | 438/4 |
| 5,808,945 A | * | 9/1998 | Arase .......................... | 365/200 |
| 5,838,620 A | | 11/1998 | Zagar et al. ................. | 365/200 |
| 5,838,625 A | | 11/1998 | Cutter et al. ............. | 365/225.7 |
| 5,883,843 A | | 3/1999 | Hii et al. .................... | 365/201 |
| 5,907,515 A | * | 5/1999 | Hatakeyama ............... | 365/200 |
| 5,910,921 A | | 6/1999 | Beffa et al. ................. | 365/201 |
| 5,917,764 A | | 6/1999 | Ohsawa et al. .............. | 365/200 |
| 5,959,929 A | | 9/1999 | Cowles et al. .......... | 365/230.03 |
| 5,978,298 A | | 11/1999 | Zheng ..................... | 365/225.7 |
| 6,055,611 A | | 4/2000 | Wright et al. ............... | 711/162 |
| 6,065,090 A | * | 5/2000 | Deas ............................ | 711/1 |

(Continued)

OTHER PUBLICATIONS

Tarr, et al., Defect analysis system speeds Test and Repair of Redundant Memories, M. Electronics, Jan. 12, 1984, pp. 175-179, vol. 57, No. 1, VNU Business Pub ications, New York, U.S.A.*

(Continued)

*Primary Examiner*—Cynthia Britt
(74) *Attorney, Agent, or Firm*—TraskBritt

(57) ABSTRACT

In a memory device, an on-die register is provided that is configured to store a row address as well as a column address of a memory cell that fails a test. Storing the row address frees testing from being limited to activating at one time only rows related to a common redundant segment. Storing the row address also guides repair using segmented redundancy. As an addition or alternative, information may be stored in an anti-fuse bank that is designed to provide access to a redundant cell but has not yet enabled access to that cell. If the information stored in the anti-fuse bank relates to the failure of the redundant cell, such information may be used to avoid repairing with that redundant cell.

20 Claims, 10 Drawing Sheets

U.S. PATENT DOCUMENTS

| | | | |
|---|---|---|---|
| 6,088,282 A | 7/2000 | Loughmiller et al. | 365/225.7 |
| 6,104,645 A | 8/2000 | Ong et al. | 365/200 |
| 6,115,301 A * | 9/2000 | Namekawa | 365/200 |
| 6,115,828 A | 9/2000 | Tsutsumi et al. | 714/7 |
| 6,119,251 A | 9/2000 | Cloud et al. | 714/718 |
| 6,130,834 A | 10/2000 | Mullarkey et al. | 365/96 |
| 6,144,593 A | 11/2000 | Cowles et al. | 365/200 |
| 6,145,092 A | 11/2000 | Beffa et al. | 714/7 |
| 6,154,398 A | 11/2000 | Cutter et al. | 365/200 |
| 6,154,851 A | 11/2000 | Sher et al. | 714/5 |
| 6,249,465 B1 * | 6/2001 | Weiss et al. | 365/200 |
| 6,249,893 B1 | 6/2001 | Rajsuman et al. | 714/741 |
| 6,269,035 B1 | 7/2001 | Cowles et al. | 365/200 |
| 6,314,030 B1 * | 11/2001 | Keeth | 365/200 |
| 6,396,300 B1 | 5/2002 | Loughmiller et al. | 326/16 |
| 6,417,695 B1 | 7/2002 | Duesman | 326/47 |
| 6,418,069 B2 | 7/2002 | Schamberger et al. | 365/200 |
| 6,424,584 B1 | 7/2002 | Seyyedy | 365/225.7 |
| 6,434,067 B1 | 8/2002 | Blodgett | 365/200 |
| 6,640,321 B1 * | 10/2003 | Huang et al. | 714/720 |
| 6,795,942 B1 | 9/2004 | Schwarz | 714/718 |
| 6,862,703 B2 * | 3/2005 | Oonk | 714/718 |
| 2002/0133767 A1 | 9/2002 | Cowles | 714/719 |
| 2002/0133769 A1 | 9/2002 | Cowles et al. | 714/719 |
| 2002/0133770 A1 | 9/2002 | Cowles et al. | 714/723 |
| 2003/0028834 A1 * | 2/2003 | Brown et al. | 714/711 |
| 2004/0003315 A1 * | 1/2004 | Lakhani et al. | 714/8 |
| 2004/0128593 A1 * | 7/2004 | Grinchuk et al. | 714/710 |

OTHER PUBLICATIONS

Ganapathy, et al., "Yield Modeling and Optimization of Large Redundant RAM's" 1990 International Conference on Wafer Scale Integration, WSI Design and Support Technology, pp. 273-287, IEEE Comput. Soc.*

Dilip K. Bhavsar, "An Algorithm for Row-Column Self-Repair of RAMs and Its Implementation in the Alpha 21264" ITC International Test Conference, 1999, pp. 311-318, IEEE.*

Heon-Cheol Kim, "A BISR (Built-In Self-Repair) Circuit for Embedded Memory With Multiple Redundancies" 1999 IEEE, pp. 602-605.*

Micron Technology, Inc.; "Synchronous DRAM" Data Sheets; 128Mb: x4, x8, x16 SDRAM, 128MSDRAM_*Rev* B_, Pub. 10/00, pp. 1-58.

Micron Technology, Inc.; "Synchronous DRAM" Data Sheets; 128Mb: x32 SDRAM, Rev. 9/00, pp. 1-52.

* cited by examiner

Table 1: Test/Repair Sequences

| | Prior Art | Exemplary Empodiment of Current Invention |
|---|---|---|
| 1 | Activate R0 and R1 | Activate all rows R0 – R3 |
| 2 | Write to at least one column | Write to at least one column |
| 3 | Read from the cells in R0 and R1, compare | Read from the cells in all rows, compare |
| 4 | Repair cell at R0C0 using segment S1 | Repair cell at R2C3 using segment S2 |
| 5 | Precharge | Clear register |
| 6 | Activate R2 and R3 | Read from the cells in all rows, compare |
| 7 | Write to at least one column | Repair cell at R0C0 using segment S1 |
| 8 | Read from the cells in R2 and R3, compare | |
| 9 | Repair cell at R2C3 using segment S2 | |

FIG. 2

CIRCUIT AND METHOD FOR ERROR TEST, RECORDATION, AND REPAIR

TECHNICAL FIELD

The present invention relates generally to the computer memory field and, more specifically, to the testing and repairing of memory.

BACKGROUND OF THE INVENTION

A memory device typically comprises a semiconductor die including a plurality of memory cells arrayed in rows and columns. The die also includes input/output terminals configured to transmit information relating to a cell's address, the row and column that may be used to access that cell. The die further includes at least one input/output terminal configured to transmit data to or from the cell at a certain address. At least one additional input configures the die to receive external data at the data terminal and store that data in a cell designated by the address signal. In such a configuration, the memory is in a "write" mode. Changing the state of that input (or providing another input) configures the die to transmit to the data terminal data stored in a cell designated by the address signal. In such a configuration, the memory is in a "read" mode.

It may be desirable to test the memory cells at some point during the construction of a memory device. One conventional method of testing the memory cells is to write data to memory cells of the die, then read data from the memory cells, and compare the input with the output. Regardless of the exact test strategy, comparing the written data to the read data may result in instances where such data does not match for particular cells. Such a mismatch suggests that those cells may contain defects that may prevent proper operation of the memory.

In order to restore the functionality of a die having at least one failed memory cell, redundant cells provided on the die may be used to replace the failed cells. For example, given a column of main memory cells, including a failed cell, it is known to replace the entire column with a redundant column of cells. It may be appreciated that such a repair strategy devotes redundant cells to replacing main cells that may have not failed a test. Hence, alternative repair strategies involve using only a segment of a redundant column to replace the corresponding number of cells in a main memory column. Because a whole redundant column has not been committed to repairing what may be only a single defective cell, the redundant segments saved from use in a particular repair may be available to replace other similarly sized portions of main memory that contain failed cells.

Testing, in turn, may be enacted in a manner that accommodates the segmentation of redundancy. Specifically, only rows served by a particular redundant segment may be activated at one time during testing. Once testing and repair of those rows is completed, they are deactivated, and another section of rows, served by another redundant segment, is activated. The activation and deactivation of rows by sections may add to test time despite the desire in the art to shorten test times.

Returning to the topic of repair, circuitry may be provided on the die that allows a redundant element, be it a redundant cell, a segment of a redundant column or row, a full redundant column or row, etc., to replace a corresponding number of main memory cells that include the failed memory cell. Such circuitry may include programmable devices, wherein programming those devices indicates not only that a redundant element is being used but also which address or addresses are now to be associated with the redundant element. The programmable devices may be anti-fuses, i.e., capacitive devices that may be closed or blown by breaking down a dielectric layer therein with a relatively high voltage. In such a case, a specific combination of anti-fuses may be programmed to correspond to an address of a column having at least one failed memory cell. Such anti-fuses may be arranged in a bank with the number of anti-fuses corresponding to the number of address bits for a column address. Thus, if the failed column has a 2-bit binary address, then two anti-fuses in a bank may be programmed to store this address. A die may contain several anti-fuse banks for a respective number of redundant columns. In addition, enable circuitry including an anti-fuse may be included in each bank, wherein programming the enable circuitry's anti-fuse indicates or allows the use of a redundant element.

After repair, the incoming addresses are compared to the addresses programmed into the anti-fuse banks. If a match is detected, then a match signal is transmitted to control circuitry, such as a column decoder. The match signal indicates that a redundant column should be accessed and the failed column in the main memory array should be ignored. The control circuitry directs data accordingly.

It follows that it is desired to refrain from using defective redundant cells to repair failed main memory cells. Accordingly, it is known in the art to test the redundant cells in a manner that may be similar to testing the main memory cells. During one particular stage of testing, e.g., before the die is completely packaged, such a test may be conducted, defective redundant cells may be identified, the location of such cells may be stored by the test device, and the test device may refrain from using those redundant cells in repairing the die. However, prior art techniques tend to not retain the association between a particular die and the test device's information concerning that die's failed redundant cells. As a result, later testing, such as testing after packaging in a different test device, will not benefit from that data, and repairs resulting from that later testing may in fact undesirably use failed redundant elements.

SUMMARY OF THE INVENTION

Accordingly, exemplary embodiments of the current invention provide devices and methods for error test, recordation, and/or repair. One embodiment concerns testing a memory device having segmented redundancy, wherein the test is not restricted by the redundancy's segmentation. Such testing may be allowed by another embodiment, wherein a register is provided on the device. The register is configured to store information concerning the test. That stored information at least includes data indicating which segment of redundancy may be used to effect repairs. Such repairs, in turn, are addressed by another embodiment, wherein information concerning redundancy testing is stored on the memory device. Preferably, a bank that normally allows access to and from a redundant element is programmed in a manner that indicates the redundant element has failed a previous test. Redundant elements of this type may be avoided during repair. Further, exemplary embodiments of the current invention provide devices and methods for error test, recordation, and/or repair at any stage of production including error test, recordation, and/or repair of devices in the field.

BRIEF DESCRIPTION OF THE DRAWINGS

FIG. 2 depicts a table comparing test/repair sequences found in the prior art with those in another exemplary embodiment within the scope of the current invention.

DETAILED DESCRIPTION OF THE INVENTION

Figure 1:
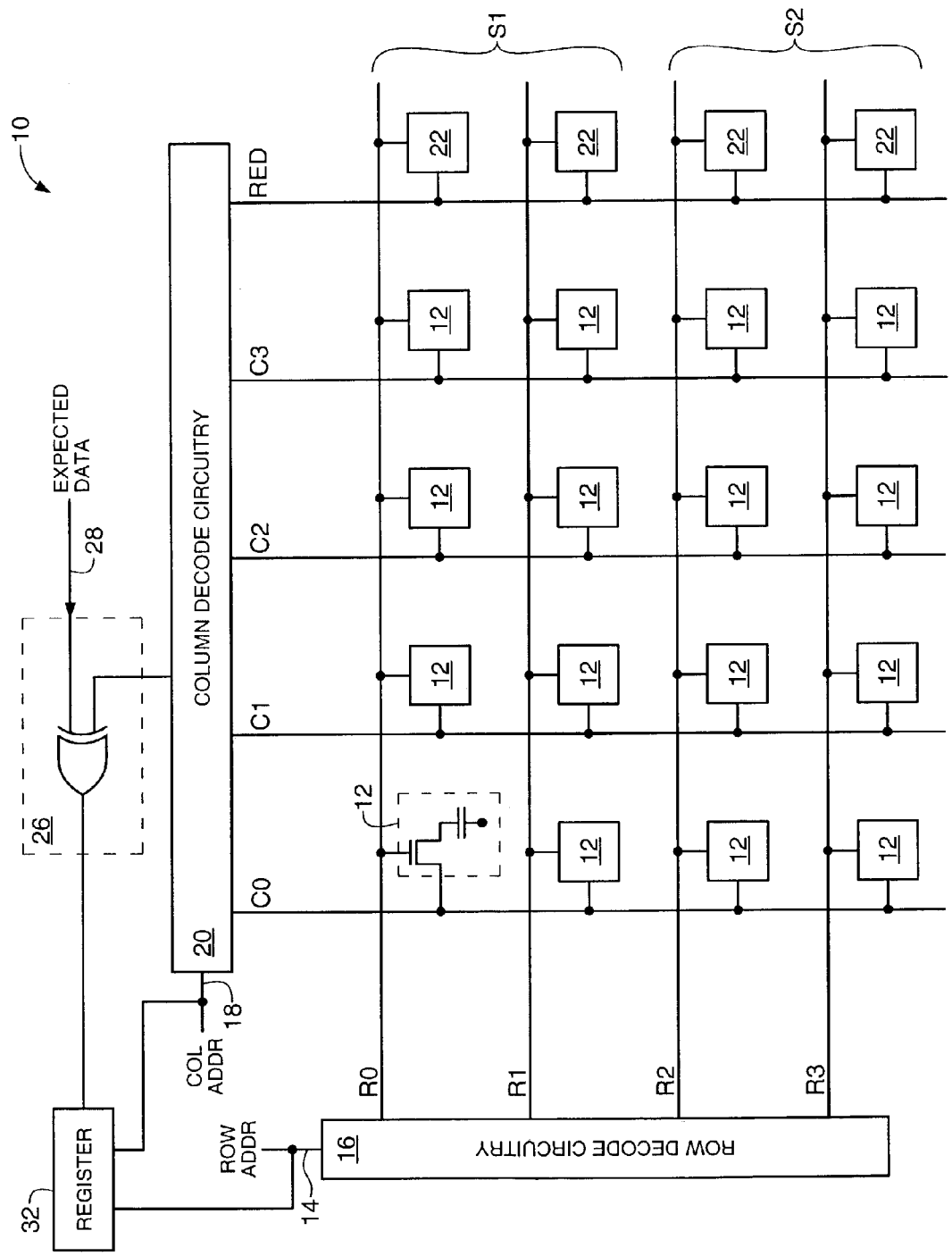
FIG. 1 illustrates a memory array and related circuitry, representing an exemplary embodiment within the scope of the current invention.

FIG. 1 illustrates a simplified portion of a die's memory array 10. Memory array 10 includes a plurality of memory cells 12 arranged in rows and columns. Accordingly, one or more memory cells 12 are accessed by the transmission of signals along row lines R0 to R3 and column lines C0 to C3. Signals are transmitted along row lines R0 to R3 based on the input from the row address line 14 as processed by the row decoder circuitry 16. Similarly, signals are transmitted along column lines C0 to C3 based on the input from the column address line 18 as processed by the column decode circuitry 20. Other components of memory array 10 will be addressed as they relate to the subjects disclosed below. It is again stressed that FIG. 1 illustrates a portion of a memory array, e.g., there may be additional cells accommodated by more rows, columns, and address lines in a particular memory bank and there may be more memory banks on a particular die. It is also again stressed that FIG. 1 illustrates a simplified memory array, e.g., there may be additional components such as sense amplifiers, data lines, and control circuitry that are present in prior art devices as well as in exemplary embodiments of the current invention. Such components are not illustrated here in order to more clearly describe the invention.

As mentioned above, it may be desirable to test a die's memory cells at some point (possibly several points) during the construction of a memory device. For instance, testing may occur while the die is part of a semiconductor wafer, part of a partial wafer, removed from the wafer yet still attached to other dice, after singulation, during die packaging, or once the memory device (chip) is completed. One conventional method of testing the memory cells is to write data to every memory cell of the die, then read data from every memory cell, and compare the input with the output.

Test strategies may vary in terms of the number of rows written to at one time and in terms of where and how the test results are stored. For example, it is known for a test device to write to all rows of a die's memory and store the addresses of failed cells off-die, i.e., within the test device itself. Other alternatives are addressed in U.S. application Ser. No. 10/022, 436, herein incorporated by reference. The specification of application '436 discloses storing the test results on-die. Preferably, the column address of the last cell to have failed the test is stored, to the exclusion of the cell's row address and the column address of any previously failed cell. However, the invention in application '436 includes within its scope embodiments wherein the row address is stored as an alternative or addition to the column address. Regardless of the exact test strategy, comparing the written data to the read data may result in instances where such data does not match for particular cells. Such a mismatch suggests that those cells may contain defects that may prevent proper operation of the memory.

In order to restore the functionality of a die having at least one failed memory cell, redundant cells may be provided on the die. In the portion of memory array 10 illustrated in FIG. 1, a column RED of redundant cells is provided. It should be noted that while only one redundant column is depicted, a typical modern high density memory device may have more than one redundant column and may also be provided with redundant rows as well.

Under one method of repairing the die, if a column in the main memory array has a failed memory cell 12, the entire column is replaced with a redundant column. To apply this example to the memory array 10 illustrated in FIG. 1, it is assumed that the memory cell 12 in row R0, column C0 failed a test while the other rows in that column passed the test. To repair that failure, the appropriate signals are sent such that the entirety of column C0 is replaced with redundant column RED. In other words, addresses that were once associated with the memory cells 12 in column C0 become isolated from those cells and associated with the redundant cells 22 of redundant column RED. An exemplary method and circuit for replacing a main column with a redundant column is addressed below. For purposes of this discussion, it is important to note that three redundant cells 22 were used to repair main memory cells 12, i.e., those in rows R1, R2, and R3 of column C0, that did not need repair. As a result, those redundant cells 22 are unavailable should other repair be needed. For instance, if the memory cell 12 in row R2, column C3 also fails a test, part or all of the die may have to be discarded.

Accordingly, another method of repairing the die concerns segmenting the redundant column, i.e., providing circuitry such that only a segment of the column is devoted to replacing a similarly sized portion of the main memory. Thus, redundant column RED may be segmented such that the first segment S1 is configured to replace memory cells 12 in columns C0 to C3 ranging from row R0 to R1. Accordingly, the second segment S2 may be configured to replace memory cells 12 in columns C0 to C3 ranging from rows R2 to R3. Returning to the scenario discussed above, segmenting the redundant column allows for replacing memory cells 12 in rows R0 and R1 of column C0 with redundant cells 22 in the first segment S1 of column RED. This segmentation also allows for replacing memory cells 12 in rows R2 and R3 of column C3 with redundant cells 22 in the second segment S2 of column RED. This example demonstrates that segmentation of redundancy may allow for full repairing (or at least a greater extent of repairing) of a die in comparison to non-segmented redundancy.

As further mentioned above, segmenting the redundant column may affect the manner in which prior art tests are performed on the memory cells 12. This may be especially true if the row address of a failed cell is never stored or if the association between the stored row address and its failed cell is not maintained. In such cases, it may not be known at the end of testing all rows which redundant segments should be applied to which failed cells. To avoid this problem, test devices may activate at one particular time only the section of rows that may be accommodated by a certain redundant column segment. One or more columns are then activated, depending upon the test, and the input data is compared to the output data. If a cell within the activated rows fails the test, then the redundant column segment designated for the activated rows is used to replace the portion of the main memory column that contains the failed cell. Once a test of the cells in a particular section of rows is complete, a PRECHARGE command is issued to deactivate that section of rows. Subsequently, there occurs activation of another section of rows that may be accommodated by another redundant column segment. Such commands add to test time, and the more memory sections there are, the more such command sequences must be used, thereby further increasing test time.

The left-most column of Table 1 in FIG. 2 illustrates a command sequence that may be used in prior art to test the memory cells 12 and make the repairs to failed memory cells 12 indicated above in discussing FIG. 1. The first prior art command is to activate rows R0 and R1, i.e., the rows accommodated by the first segment S1 of redundant column RED. Next, the memory cells 12 in at least one column within that range of rows are written to. Anywhere from one to all columns may be written to depending upon the amount of parallel testing desired. After writing (or between separate WRITE commands), the data is read from the memory cells 12 in rows R0 and R1 and compared. More specifically, a charge or lack thereof stored in the capacitor of a memory cell 12 will affect the voltage of the relevant column line, the change in voltage may be amplified by sense amplifiers (not shown), and the resulting signal and/or its complement may be transmitted to comparison circuitry. Again, reading all of the relevant memory cells 12 may involve one or more actual READ commands, depending on the test compression desired. According to the assumptions in this example, comparing will indicate that the data read from the memory cell 12 at R0, C0 will not match the data written to that memory cell 12. As a result, the failure is repaired by replacing the memory cells 12 at R0, C0 and R1, C0 with the redundant cells 22 of the first segment S1 of redundant column RED. The appropriate segment is determined by the rows activated by the external signal. Subsequently, a PRECHARGE command is issued, which deactivates rows R0 and R1. The next prior art command is to activate rows R2 and R3. Similar to the first command, this command tests the rows accommodated by a certain segment, here, the second segment S2, of redundant column RED. Writing, reading, and comparing may occur in a manner similar to the commands described above. According to the assumptions in this example, this second round of comparison will indicate that the data read from the memory cell 12 at R2, C3 will not match the data written to that memory cell 12. As a result, the failure is repaired by replacing the memory cells 12 at R2, C3 and R3, C3 with the redundant cells 22 of the second segment S2 of redundant column RED. Hence, test and repair of the die occurs in roughly nine steps. One may now appreciate that a PRECHARGE command and a new activate command is required before testing each subsequent section of rows after the first. Thus, the more segmented the redundancy in prior art devices, the more the main memory rows are divided into sections. A greater number of row sections, in turn, require a greater number of PRECHARGE and row activation commands, thereby unduly lengthening test time.

Exemplary embodiments of the current invention, however, may allow for shortening test time (or may be used to ameliorate the effect of other techniques used in combination that would otherwise unduly lengthen test time). Such embodiments allow for keeping track of at least a portion of a failed cell's address with an on-die register 32, as illustrated in FIG. 1. Such a register 32 was first addressed in application '436. The specification of application '436 also discloses that the preferred number of failed addresses to be stored in register 32 may be based on balancing the desire to fabricate as small a die as possible with the desire to increase the likelihood of being able to keep track of all addresses corresponding to defective cells after one test cycle. The greater amount of on-chip test circuitry (including a large register capable of storing many failed addresses and the supporting logic circuitry), the more likely it is to ensure such ability. The cost, however, is that a great amount of die space may be devoted to that. Conversely, a lesser amount of on-chip test circuitry (including a register capable of storing few failed addresses and less supporting logic circuitry) allows for less die space to be devoted at the cost of some ability to keep track of all failed addresses after one test cycle.

Such a balancing has been made concerning Synchronous Dynamic Random Access Memory (SDRAM) parts, including Double Data Rate (DDR) and Single Data Rate (SDR) parts recently fabricated by Micron Technology, Inc. For parts where a full redundant column replaces a similarly sized column having a failed cell in the main memory array, it is preferred to have a register 32 that stores at one time, at most, one column address of a failed cell to the exclusion of the row address. It is further preferred in such circumstances to store the address of the latest failed cell, clearing from the register 32 any former address that may have been stored. It is further preferred to store a bit indicating that at least one failure has been found. Such a bit may be known as a "fail flag."

On the other hand, for parts where redundancy is segmented, it is desirable for reasons detailed below to have a register 32 that stores both a column and row address of a failed memory cell 12, although it is still preferable to store the "fail flag" as well as the address of only one failed cell at a time, clearing any former address that may have been stored.

It is preferred to store the row address of a failed memory cell 12 in segmented redundancy circumstances because that row address may be used during repair to identify the appropriate redundant column segment. As a result, there is no need for row activation during test to be limited in order to accommodate column redundancy segmentation. Accordingly, exemplary embodiments of the current invention allow for all rows to be activated generally simultaneously during a test. One or more columns may then be activated, and the data input to the cells may be compared with the data output from the memory cells 12. In the event a memory cell 12 fails the test, preferred embodiments of the current invention indicate the occurrence of a failure by storing the "fail flag" bit in register 32 as well as the row and column address of the failed memory cell 12. If another memory cell 12 subsequently fails, its row and column address is preferably stored in place of the previous address.

The right-hand column of Table 1 in FIG. 2 illustrates a command sequence that may be used in an exemplary test method within the scope of the current invention to test the cells and make the repairs to failed memory cells 12. As with the discussion of the prior art command sequence in FIG. 2's left-hand column, the scenario relevant to the failed memory cells 12 in FIG. 1 is assumed. The first command in this embodiment is to activate all rows R0 through R3. This command demonstrates that this embodiment is not constrained to testing rows according to their relevant redundant segments. Next, the memory cells 12 in at least one column within that range of rows are written to. Anywhere from one to all columns may be written to depending upon the amount of parallel testing desired. After writing (or between separate WRITE commands), the data is read from the memory cells 12 in rows R0 through R3 and compared. Again, reading all of the relevant memory cells 12 may involve one or more actual READ commands, depending on the test compression desired. Comparison may occur on-die in a manner described in application '436, or in another manner, including off-die comparison. Regardless of whether comparison occurs on- or off-die, the comparison circuit may be as simple as comparison circuit 26 of FIG. 1, wherein the data transmitted from a memory cell 12 through the relevant column line undergoes a NOR logic operation with expected data 28 that may be supplied from an off-die source, such as a test device or a motherboard packaged with the die in a larger electronic device. Assuming memory cell 12 at R0, C0 is tested first and fails, that failure may result in a lack of a match in the comparison circuit 26. Accordingly, comparison circuit 26 may signal register 32 with a "logic 0" to store the appropriate "fail flag" bit, as well as store the row address R0 and column address C0 transmitted on lines 14, 18 to which the register 32 is coupled. Subsequently, memory cell 12 at R2, C3 may fail the test, in which case, the lack of a match in the comparison circuit 26 will cause that comparison circuit 26 to signal register 32 to store the row address R2 and column address C3. Register 32 will do so, removing the R0, C0 address from its register 32. The fourth command will involve repairing the failed memory cell 12 at R2, C3 by replacing that memory cell 12 as well as the memory cell 12 at R3, C3 with the redundant cells 22 of the second segment S2 of redundant column RED. In this exemplary embodiment, register 32 transmits a signal based on the stored row address directing which redundant column segment to use. Such direction may occur by a transmission to circuitry that is coupled to register 32 and included as part of redundancy circuitry, address decoder circuitry, control circuitry, combinations thereof, or circuitry discrete therefrom.

Subsequently, register 32 is cleared of its address and "fail flag" information, an act that takes less time than deactivating one section of rows and activating another section. Data is then once again read from the cells in rows R0 through R3 and compared. Presumably, memory cell 12 at R0, C0 will fail once again, and comparison circuit 26 will signal register 32 to store the appropriate "fail flag" bit, as well as store the row address R0 and column address C0 accordingly. Assuming no other fails are found, the seventh command will involve repairing the failed memory cell 12 at R0, C0 by replacing that memory cell 12, as well as the memory cell 12 at R1, C0 with the redundant cells 22 of the first segment S1 of redundant column RED. As with the previous repair, the row address stored in register 32 determines which redundant column segment to use.

Accordingly, redundancy circuitry is provided on a die that allows a redundant element, e.g., a redundant cell, a segment of a redundant column or row, a full redundant column or row, etc., to replace a corresponding number of main memory cells that include the failed memory cell. As mentioned above, such circuitry may include programmable devices, wherein programming those devices indicates not only that a redundant element is being used but also which address or addresses are now to be associated with the redundant element. An example redundancy circuit 34 that may be used for replacing redundant elements is depicted in FIG. 3.

Figure 3:
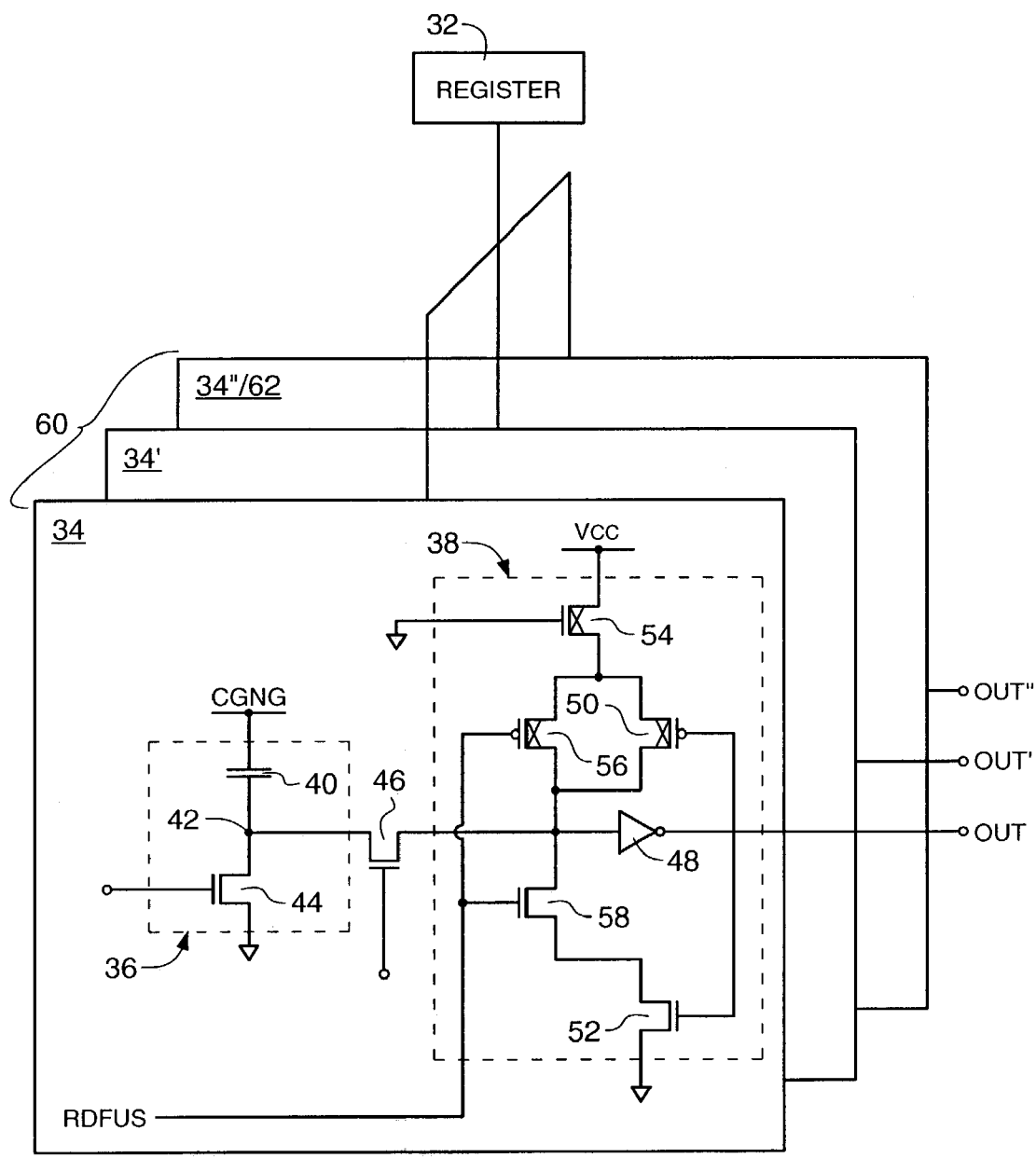
FIG. 3 pictures an anti-fuse bank circuit and related circuitry, representing still another exemplary embodiment within the scope of the current invention.

FIG. 3's redundancy circuit 34 comprises an anti-fuse circuit 36 and a latch circuit 38. The anti-fuse circuit 36 comprises a capacitor, the anti-fuse 40, wherein one plate of the capacitor is configured to couple to a voltage source CGND and the other is configured to couple to ground through node 42 and a transistor 44. Before blowing, the dielectric between the plates of anti-fuse 40 is intact, thereby electrically isolating node 42 from CGND. In a non-limiting example of blowing the anti-fuse, CGND is established to be 10 volts and the gate of transistor 44 is driven for at least 2 milliseconds. As a result, the dielectric between the plates of anti-fuse 40 breaks down, and a conductive path from CGND to node 42 is established. Subsequently, the gate of transistor 44 is no longer driven, and the voltage of CGND is lowered, preferably to less than Vcc.

While CGND is high, however, there is a risk of damaging the latch circuit 38. In order to prevent such damage, a voltage regulation transistor 46 is electrically interposed between the anti-fuse circuit 36 and the latch circuit 38. This voltage regulation transistor 46 is turned off during the anti-fuse blowing mode. In other modes, a voltage that is less than Vcc is applied to the gate of voltage regulation transistor 46. Such a voltage provides enough electrical communication for reading the state of the anti-fuse 40 using latch circuit 38 while protecting it from excess voltages.

An example of latch circuit 38 includes an inverter 48 with an input coupled to node 42 (through voltage regulation transistor 46) and an output node OUT that drives a p-channel transistor 50 and an n-channel transistor 52. The p-channel transistor 50 has a source coupled to Vcc (assumed to be 3 volts) through a current-limiting p-channel transistor 54, whose gate is grounded. The drain of p-channel transistor 50 is coupled to the input of inverter 48. The n-channel transistor 52 has a source coupled to ground. A second p-channel transistor 56 has its source coupled to Vcc (through p-channel transistor 54) and its drain coupled to the input of inverter 48. A second n-channel transistor 58 has its drain coupled to the input of inverter 48 and its source coupled to the drain of n-channel transistor 52. The gates of second n-channel transistor 58 and second p-channel transistor 56 are coupled and driven by a signal RDFUS that is transmitted when one desires to read whether the anti-fuse has been blown.

The results of such reading depend on whether the anti-fuse 40 is blown, assuming CGND represents a low enough voltage. In any case, the status of the anti-fuse 40 is read when RDFUS represents a low voltage or "logic 0" signal. Such a signal turns on the second p-channel transistor 56 and turns off the second n-channel transistor 58. As a result, the transistors 56 and 58 in this state attempt to raise the voltage of node 42 and the input of the inverter 48 to Vcc. If the anti-fuse 40 is unblown, node 42 is isolated from the low CGND voltage (and it is assumed that transistor 44 is off as well). Because the input of inverter 48 has a high voltage, its output OUT is a low voltage or "logic 0" signal, which represents the fact that the anti-fuse is unblown. If the anti-fuse is blown, however, then there is a path from node 42 and the input of inverter 48 to a voltage lower than Vcc, e.g., CGND. The resulting discharge results in a low voltage or "logic 0" signal input to inverter 48. Accordingly, the output OUT of inverter 48 is a high voltage or "logic 1" signal, which represents the fact that the anti-fuse is blown.

Such a redundancy circuit 34 may be used to represent a bit in a memory address. Accordingly, a plurality of such circuits 34 may be used to represent a full memory address or a portion thereof, such as the column address. A comparison between an address input to the die and the outputs of redundancy circuits 34 may result in a match, signifying that the address was associated with a failed cell in the main memory array and should instead be associated with a redundant cell. In accordance with the exemplary memory array 10, two redundancy circuits 34 and 34' having similar configurations may be included in an anti-fuse bank 60. Each of the two redundancy circuits 34 and 34' is capable of one of two output values, i.e., logic 0 or logic 1. As a result, the anti-fuse bank 60 is able to transmit one of the four values the column address line(s) 18 may have. In addition, a third redundancy circuit 34" of similar configuration may be included in anti-fuse bank 60, whose output signifies whether a redundant element has already been enabled, i.e., used to repair the main memory array 10. Accordingly, such a redundancy circuit 34" may also be dubbed an enable redundancy circuit 62.

In accordance with the exemplary test discussed above, which resulted in failed memory cells 12 at R2, C3 and R0, C0, it is assumed that (1) column address line 18 actually comprises two column address lines 18A and 18B, and (2) the columns C0 to C3 are accessed based on the values transmitted by column address lines 18A and 18B in the manner illustrated in Table 2 below.

TABLE 2

| COLUMN | COLUMN ADDRESS LINE 18A | COLUMN ADDRESS LINE 18B |
|---|---|---|
| C0 | 0 | 0 |
| C1 | 0 | 1 |
| C2 | 1 | 0 |
| C3 | 1 | 1 |

Continuing with the assumption that R2, C3 was the last address found to be associated with a failed memory cell 12 and is the only address stored in register 32, repair begins by checking to see if there is an available redundant element. Specifically, in this example, the output OUT" is examined. Based on the operation of the circuitry described above, OUT" transmitting a logic 0 will indicate that the redundant element has not been enabled and is, therefore, available for repair. It is assumed that OUT" does in fact transmit a logic 0 and, as a result, the anti-fuses 40 in both redundancy circuits 34 and 34' are blown or retained according to the column address stored in register 32. In this case, register 32 is storing the column address C3, so the anti-fuses 40 in both redundancy circuits 34 and 34' are blown, resulting in logic 1 outputs. Further, if the redundancy is segmented, then the row address stored in register 32 is also transmitted to the appropriate segmentation circuitry, be it in the anti-fuse bank 60, address decoding circuitry, control circuitry, combinations thereof, or elsewhere. The anti-fuse 40 in enable redundancy circuit 62 is blown as well.

Figure 4:
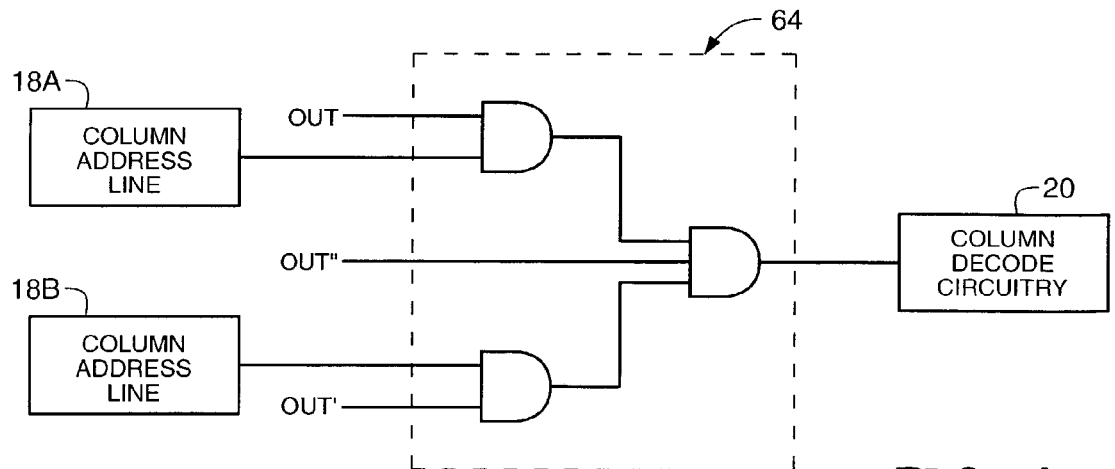
FIG. 4 illustrates comparison circuitry within the scope of the current invention.

When the column address inputs for C3 are subsequently transmitted through column address lines 18A and 18B during a test or non-test mode, they are compared with the corresponding bits transmitted by the anti-fuse bank 60, as indicated by the redundancy comparison circuitry 64 in FIG. 4. Had there been no match or a non-enabled redundant element, the logic 0 output of redundancy comparison circuitry 64 would have directed the column decode circuitry 20 to access the corresponding column in the main memory array 10. However, because of the anti-fuses 40 blown in the circumstances addressed above, the address input on column address lines 18A and 18B match the outputs OUT and OUT', respectively. Output OUT" of enable redundancy circuit 62 transmits a logic 1 signal, indicating a redundant element has been enabled. As a result, the logic 1 output of redundancy comparison circuitry 64 directs the column decode circuitry 20 to access a redundant element from redundant column RED, be that element the entirety of redundant column RED, a segment thereof, as directed by the row address in register 32, or an individual redundant cell 22.

It is not desirable to repair failed memory cells 12 in the main memory array 10 with defective redundant cells 22. Accordingly, the redundant cells 22 may undergo testing at some point in a manner similar to the testing of the memory cells 12 in the main memory array 10. Moreover, a particular test device may keep track of a die's failed redundant cells 22 and refrain from using them to repair failed memory cells 12 in the die's main memory array 10. However, as mentioned above, while this may occur when that die is within a particular test device, the information relating to defective redundant cells 22 may not be retained or associated with the relevant die in the event the die undergoes additional testing at a later fabrication stage and/or once the die is in another device. This occurs often in the prior art, where a die is tested before complete packaging and failed redundant cell information is gathered and utilized at that point, but that information becomes disassociated from the die by the time it is completely packaged and retested in another device. Hence, attempts to repair as a result of subsequent testing may result in replacing a failed main memory cell 12 with a defective redundant cell 22.

Exemplary embodiments of the current invention allow for information related to failed redundant cells to be stored on-die. While such embodiments include those wherein additional circuitry, such as a register, is provided to store such information, it is preferred to store such information using existing circuitry in order to save die space. Accordingly, at least one exemplary embodiment stores the information related to failed redundant cells in the anti-fuse bank 60. In one example of such embodiments, a failed redundant element is identified by blowing at least one of the anti-fuses 40 in redundancy circuits 34, 34' without blowing the fuse 40 of the enable redundancy circuit 62.

Figure 5:
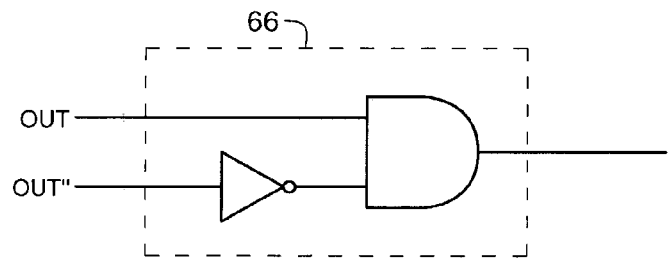
FIG. 5 depicts other circuitry within the scope of the current invention.

Circuitry could then be monitored to determine whether the redundant element associated with that fuse bank 60 contains a failed redundant cell 22. In one embodiment, output OUT from redundancy circuit 34 may be designated to indicate a failed redundant cell 22. Thus, for example, during pre-package testing of a die's redundant elements, if a redundant cell 22 fails a test, the test device may direct the blowing of anti-fuse 40 in redundancy circuit 34 of the relevant anti-fuse bank 60 while retaining the integrity of anti-fuse 40 in the enable redundancy circuit 62. During a subsequent repair mode, such as one conducted in a different machine after packaging, an on- or off-chip circuit 66 such as the one depicted in FIG. 5 may be used to determine whether an anti-fuse 40 corresponding to an address bit had been blown without blowing the anti-fuse 40 corresponding to an enable bit. In such an event, the circuit 66 would output a logic 1, directing control circuitry to refrain from using the redundant element associated with the relevant anti-fuse bank 60. Otherwise, the circuit 66 would output a logic 0, indicating that a redundant element of anti-fuse bank 60 did not fail a test. Further analysis of the output OUT" would then determine whether the redundant element is free for repair.

Figure 6:
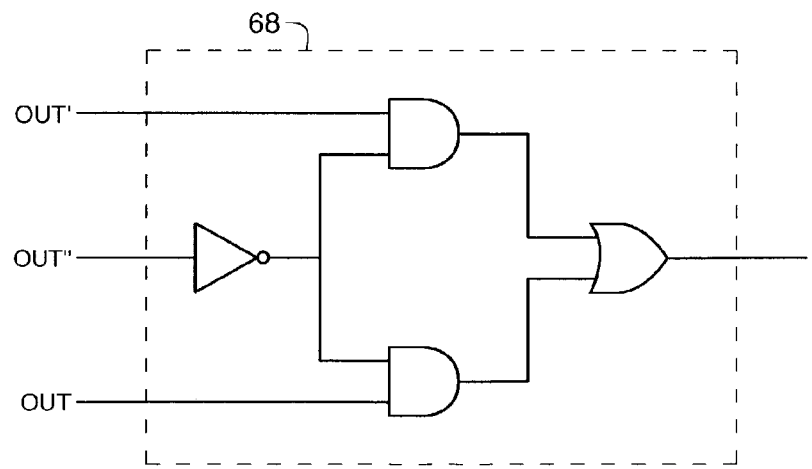
FIG. 6 pictures still other circuitry within the scope of the current invention.

Alternative circuitry could be used to determine whether the redundant element associated with a fuse bank 60 contains a failed redundant cell 22. The circuit 68 in FIG. 6 does not require designating a particular redundant circuit 34 or 34' to indicate a failed redundant element. Rather, if a redundant cell 22 fails a test, the test device may direct the blowing of the anti-fuse 40 in redundancy circuit 34, redundancy circuit 34', or both 34 and 34'. During a subsequent repair mode, circuit 68 would output a logic 1, directing control circuitry to refrain from using the redundant element associated with the relevant anti-fuse bank 60.

One skilled in the art can appreciate that, although specific embodiments of this invention have been described above for purposes of illustration, various modifications may be made without departing from the spirit and scope of the invention. For example, anti-fuse bank 60 may be used to store information alternative to or in addition to the sheer fact that a redundant cell 22 has failed a test. The multiple bits represented by the state of redundancy circuits 34 and 34' allow for storing data such as which test the redundant element failed. Further, if the redundant element is not to be used for repairing the main memory array, the relevant anti-fuse bank may be used to store data other than that related to failed redundant cells.

In addition, although the embodiments discussed above use anti-fuses, such devices are not a requirement for embodiments of the current invention. Rather, the invention includes within its scope, embodiments using fuses, e.g., blown by laser, electricity, etc., other switching devices, or combinations thereof.

Moreover, embodiments using the on-die register 32 to store data relating to failed main cells and embodiments using the anti-fuse bank 60 to store data relating to failed redundant cells may be used alone or in combination.

Concerning register 32, it may be possible to have a register 32 that stores the address of the first failed memory cell 12 in the memory array 10 rather than the last. Any failed addresses subsequently detected during a test may be eschewed until the register 32 is cleared for the next test. Alternatively, it may be preferred in certain circumstances to store some address other than the first or the last failed memory cell 12. Moreover, the register 32 could store a plurality of row and column addresses, at least one of which is unrelated to the others in terms of its row or column. It is also not necessary to store an address in register 32, as other information may be stored to indicate the availability of at least one redundant cell. Still other embodiments include those wherein the register is not limited to being on-chip.

In addition, exemplary embodiments of the current invention are not limited to circumstances wherein a redundant element replaces at least one memory cell 12 in the main memory array 10. Rather, the invention includes within its scope embodiments wherein a redundant element is used in conjunction with the corresponding main memory array 10 memory cells 12 that remain in use. This could be done in order to enhance performance or ameliorate the effect of devices or methods that provide some benefit and would otherwise unduly affect performance. For example, retaining the un-blown state of the anti-fuse 40 of an enable redundancy circuit 62 while blowing at least one of the other anti-fuses 40 in an anti-fuse bank 60, may be used to signify the unavailability of a redundant element for non-repair purposes.

As for testing, while at least some exemplary embodiments within the scope of the current invention involve activating all rows generally simultaneously, such is not a requirement under the invention. Also included in the invention's scope are embodiments wherein fewer than all rows may be activated during a test. In either case, the rows activated are free of dependency upon the redundancy segmentation scheme.

Figure 7:
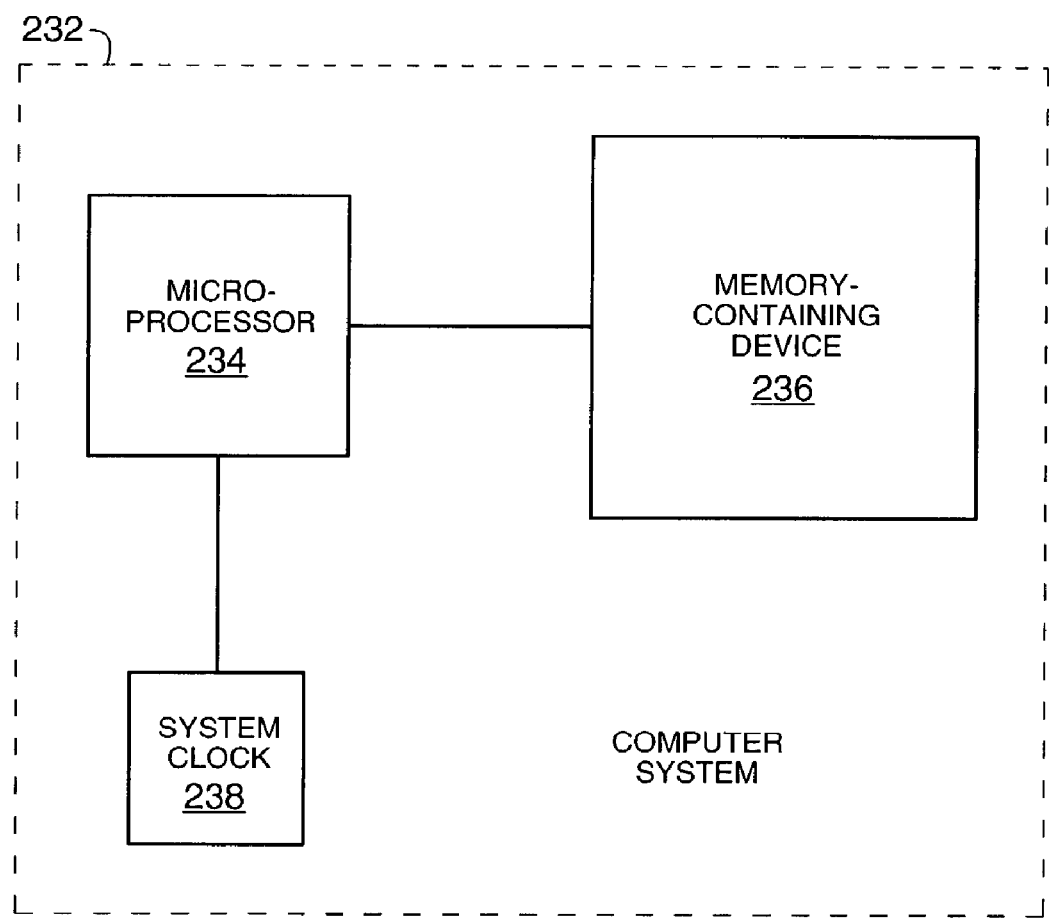
FIG. 7 depicts another exemplary apparatus embodiment within the scope of the current invention.

Further, exemplary embodiments of the current invention may generally accommodate systems using memory, wherein the memory can include nonvolatile, static, or dynamic memory, and wherein the memory can be a discrete device, embedded in a chip with logic, or combined with other components to form a system on a chip. For example, FIG. 7 illustrates a computer system 232, wherein a microprocessor 234 transmits address, data, and control signals to a memory-containing device 236, such as one including, but not limited to, those described above. A system clock circuit 238 provides timing signals for the microprocessor 234.

It has already been mentioned above that testing may occur while the die is part of a semiconductor wafer, part of a partial wafer, removed from the wafer yet still attached to other die, after singulation, during die packaging, or once the memory device (chip) is completed. Accordingly, the error recordation and/or repair methods within the scope of the current invention may also be used at any one or combination of these stages. Such error recordation and/or repair methods can occur on any device capable of handling the die based on its state of singulation or packaging, including AMBYX and TERADYNE® devices. Such error test, recordation and/or repair methods can occur during a test, probe, or burn-in (including cold burn-in) process.

Figure 8A:
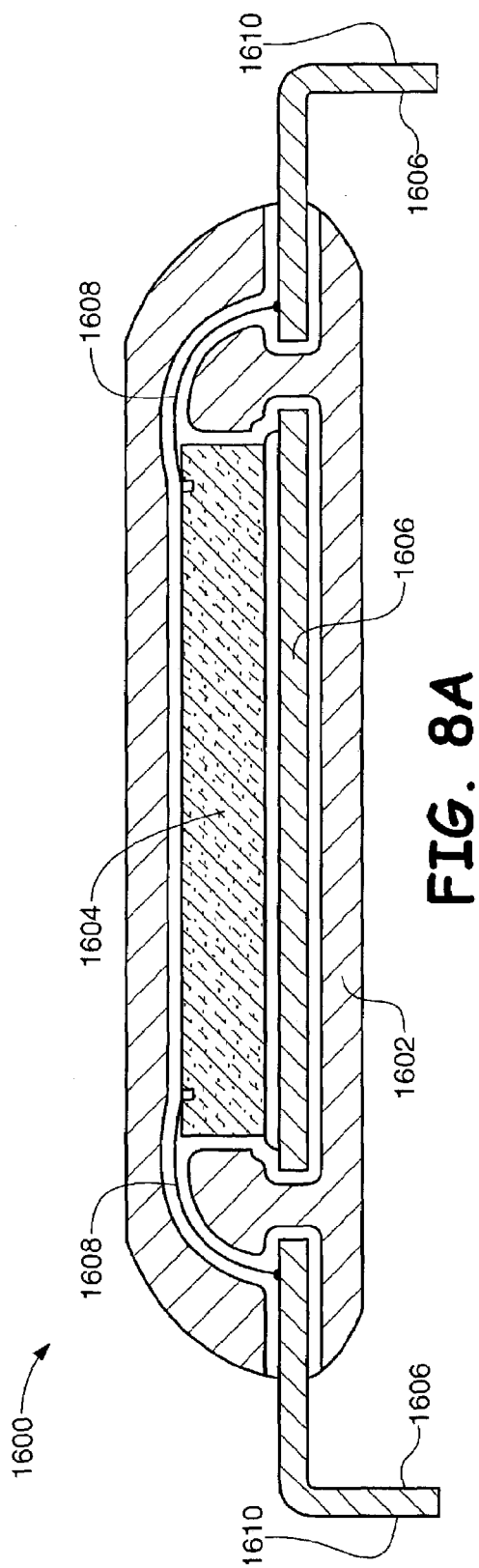
FIG. 8A depicts a cross-section of a single die package within the scope of the current invention.

Moreover, error test, recordation, and/or repair methods within the scope of the invention may occur at even later stages in at least one exemplary embodiment of the current invention. For example, such error test, recordation, and/or repair methods may occur once a die is "in the field," wherein the die is out of the die producer's control. Such circumstances may include those wherein the die has been incorporated as part of an electronic system for an indefinite period of time. Incorporation may involve a single die in a package such as the package 1600 seen in FIG. 8A, wherein encapsulant 1602 protects a die 1604 that is mounted on a lead frame 1606, and wires 1608 are bonded to the die 1604 and lead fingers 1610 of the lead frame 1606. Other packages that may be relevant to exemplary embodiments of the current invention include, but are not limited to, flip chip packages, chip scale packages, ball grid array (BGA) packages, land grid array (LGA) packages, pin grid array (PGA) packages, dual in-line packages (DIP), zig-zag in-line packages (ZIP), leadless chip carrier (LCC) packages, small outline packages (SOP), thin small outline packages (TSOP), quad flat pack (QFP) packages, and small outline j-bend (SOJ) packages.

Figure 8B:
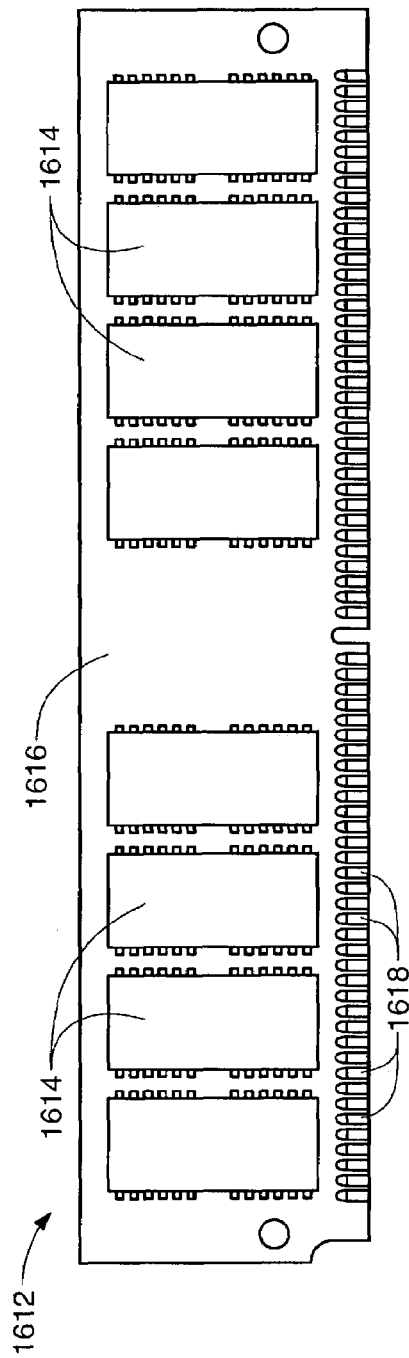
FIG. 8B depicts a top-down view of a multi-chip module within the scope of the current invention.

Alternatively, error test, recordation, and/or repair may occur on a die that is packaged as part of a multi-chip module 1612, as seen in FIG. 8B, wherein a plurality of dice 1614 are mounted onto a support surface such as a printed circuit board 1616. The die 1614 may be linked by conductive traces (not shown) in or on the printed circuit board 1616. At least some of these traces connect with conductive contacts 1618 in one or more rows along at least one edge of the printed circuit board 1616.

Moreover, combinations of the packages described above are included within the scope of the invention, one example being a flip chip on module (FCOM), wherein flip chips are bonded to a common substrate such as a printed circuit board.

Figure 9:
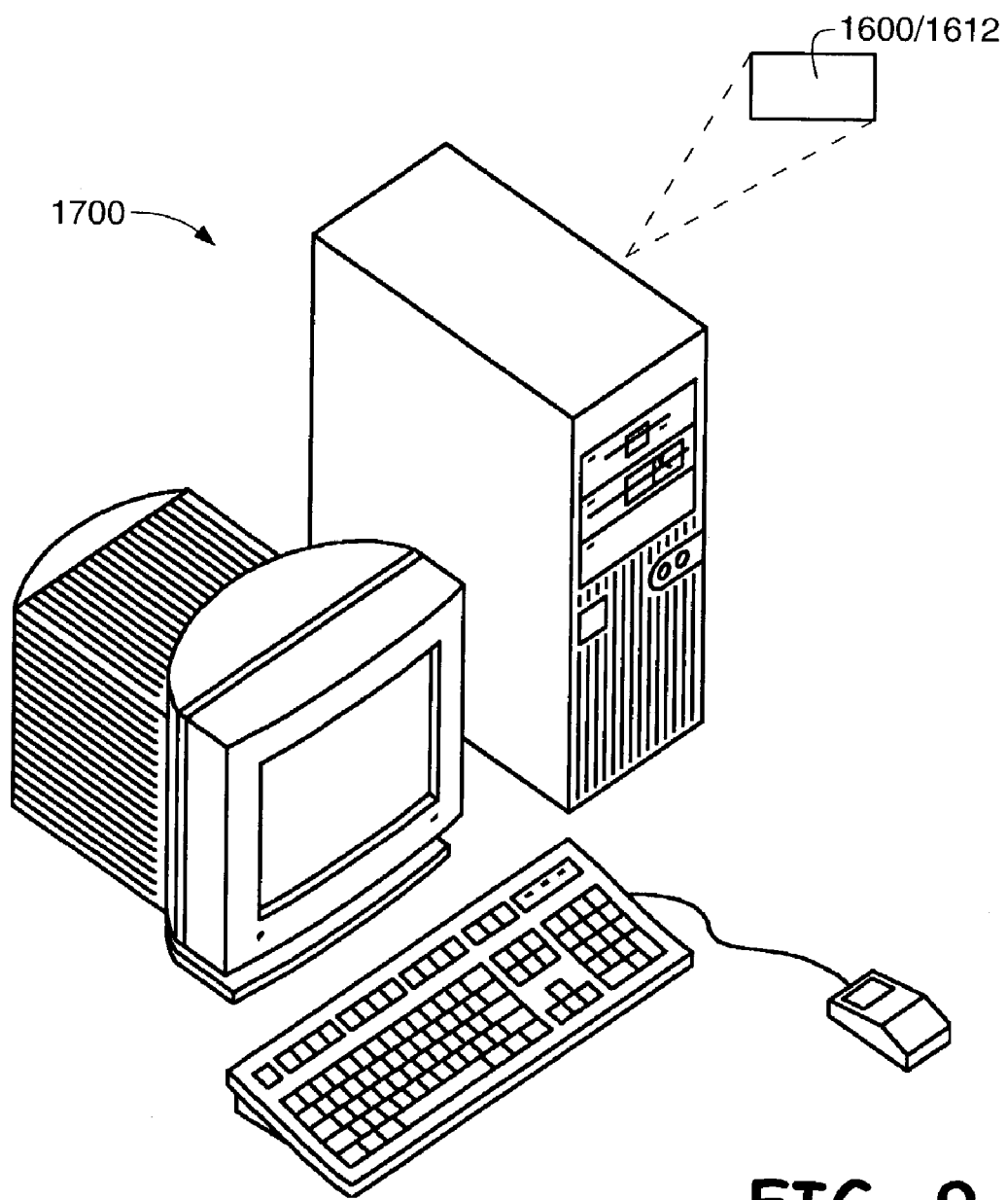
FIG. 9 depicts a desktop computer system within the scope of the current invention.
Figure 10:
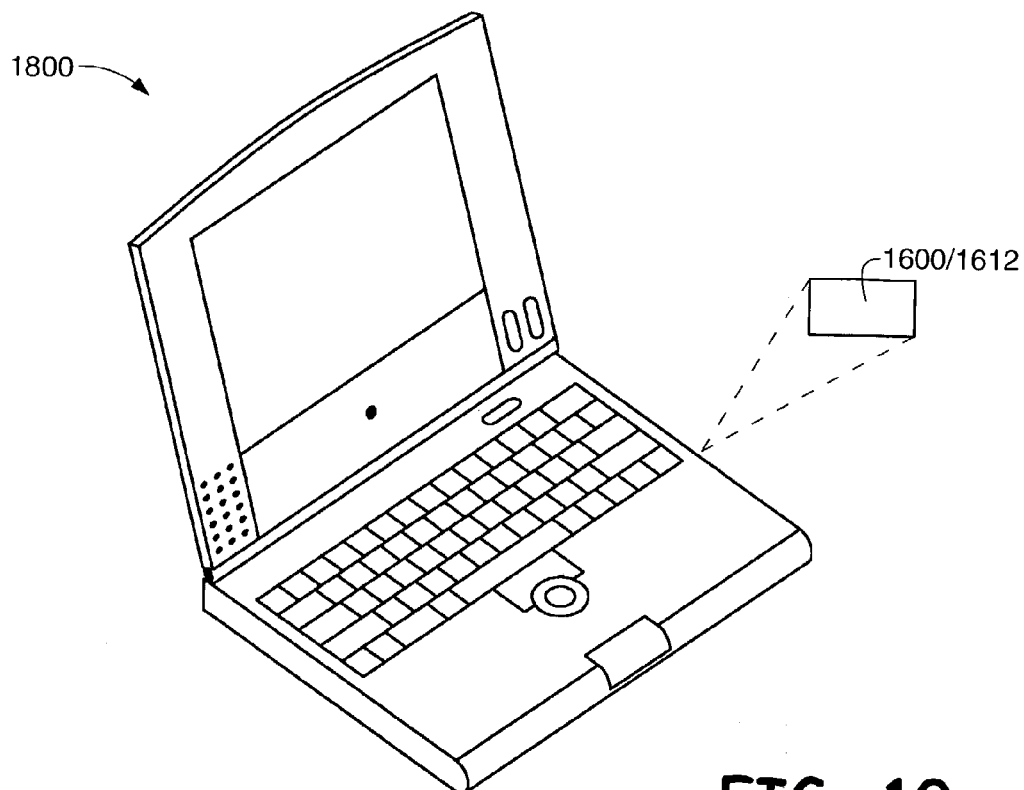
FIG. 10 depicts a laptop computer system within the scope of the current invention.
Figure 11:
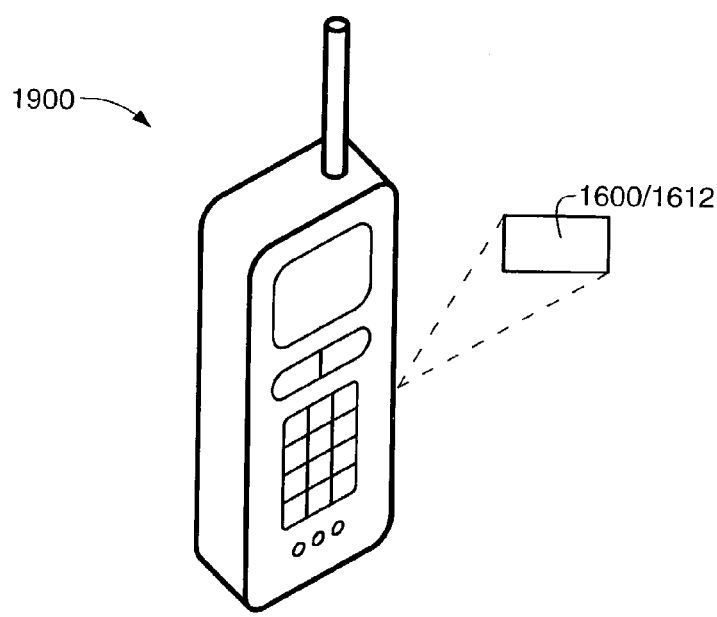
FIG. 11 depicts a cellular phone system within the scope of the current invention.

Exemplary electronic systems that are "in the field" and incorporate any of the packages described above, as well as alternative packages, may include a computer system such as a desktop computing system 1700 (FIG. 9) or a laptop computing system 1800 (FIG. 10). "In the field" circumstances also include those wherein the die is part of an electronic system such as a cellular phone 1900 (FIG. 11), where again the die could be packaged singly or with other dice in a module. Moreover, "in the field" circumstances include those wherein the die is part of a system that is a combination or hybrid of the systems described above as well as others.

Figure 12:
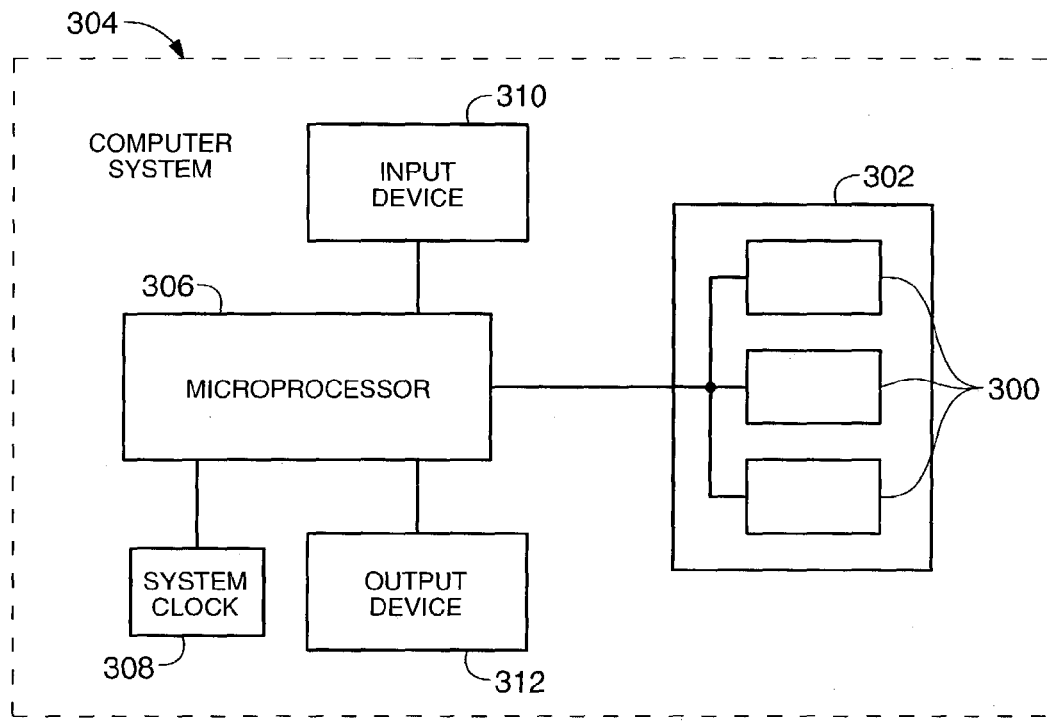
FIG. 12 depicts a computer system within the scope of the current invention.

Focusing on error testing under such circumstances, it follows that the test signals sent to the die need not originate from a device devoted primarily to testing, such as the AMBYX tester. Rather, they may be transmitted from a larger system incorporating the chip, such as the systems described above. In a preferred embodiment of this type, depicted in FIG. 12, several chips 300 are part of a memory module 302, which is in turn a part of a computer system 304. An embodiment wherein several chips 300 are in a module 302 is preferred because, as with testing chips in a tester, signals may be transmitted to the module's chips 300 in parallel. Computer system 304 further comprises a microprocessor 306 that transmits addresses, data, and control signals to the module 302, a system clock 308 that provides timing signals for the microprocessor 306, at least one input device 310 that may include a keyboard, mouse, joystick, touchpad, microphone, video camera, modem, etc., and at least one output device 312 that may include a monitor, speaker, printer, modem, or virtual-reality goggles.

Testing may be initiated by signals from at least one input device 310. Such a configuration of the computer system is preferred because it would allow one to initiate testing when desired. It is additionally preferred that the microprocessor 306 be configured to initiate testing as well. This configuration of the computer system 304 is even more preferred because it would allow testing while the computer system 304 is in a power management mode, such as a "sleep mode," wherein power to and/or activity of at least one of the system's components is lessened. Such a configuration also allows the microprocessor 306 to initiate testing after an input device 310 has not transmitted a signal for an amount of time, analogous to the way a computer system's screen saver program may be initiated. In this exemplary embodiment, the microprocessor 306 writes test data to the chips 300 and maintains transmission of this data while the chips 300 are in a read mode. Comparison of the read data with the transmitted data occurs within the computer system 304 and may in fact occur on each chip 300, as detailed in application '436. While in the read mode, as many as all of the rows may be activated generally simultaneously, as on-die register 32 allows for the storage of test results such that testing is not limited by redundancy segmentation. Further, if it is a redundant element being tested, the results may be stored in an anti-fuse bank 60 as discussed above.

Regardless of how testing is initiated or carried out in the field, the results of the error detection may be addressed by updating the computer system's Basic Input Output System (BIOS). BIOS is a sequence of instructions that may be stored in read-only memory (ROM). The BIOS instructions concern power-up, self-test, and communication between components on the computer system's motherboard, among other functions. Obtaining an updated BIOS may occur in several ways. For example, the results of the error detection may be transmitted to at least one output device 312 of the computer system 304 and, in response, one may use an input device 310 to instruct the computer system 304 to access the internet and download the BIOS update from an appropriate internet site. As another example, just as testing may be performed automatically by the microprocessor 306, so too may the downloading process be automatic, with the microprocessor 306 contacting the internet site and downloading the BIOS update without receiving a particular signal from an input device 310. This alternative may occur in a power management mode as discussed above. Still another alternative within the scope of the invention involves transferring the BIOS update to the computer system 304 from a mobile storage device such as a floppy disk, CD-ROM, or DVD-ROM.

It is preferred that the updated BIOS contain a set of instructions that allow for blowing at least one anti-fuse on at least one chip 300 identified as having a defective memory cell. It is further preferred that the set of instructions also be able to return the chip 300 to a normal state of operations and, in an even more preferable embodiment, provide some sort of flag or indication via an output device 312 that an error has been found and repaired.

Figure 13:
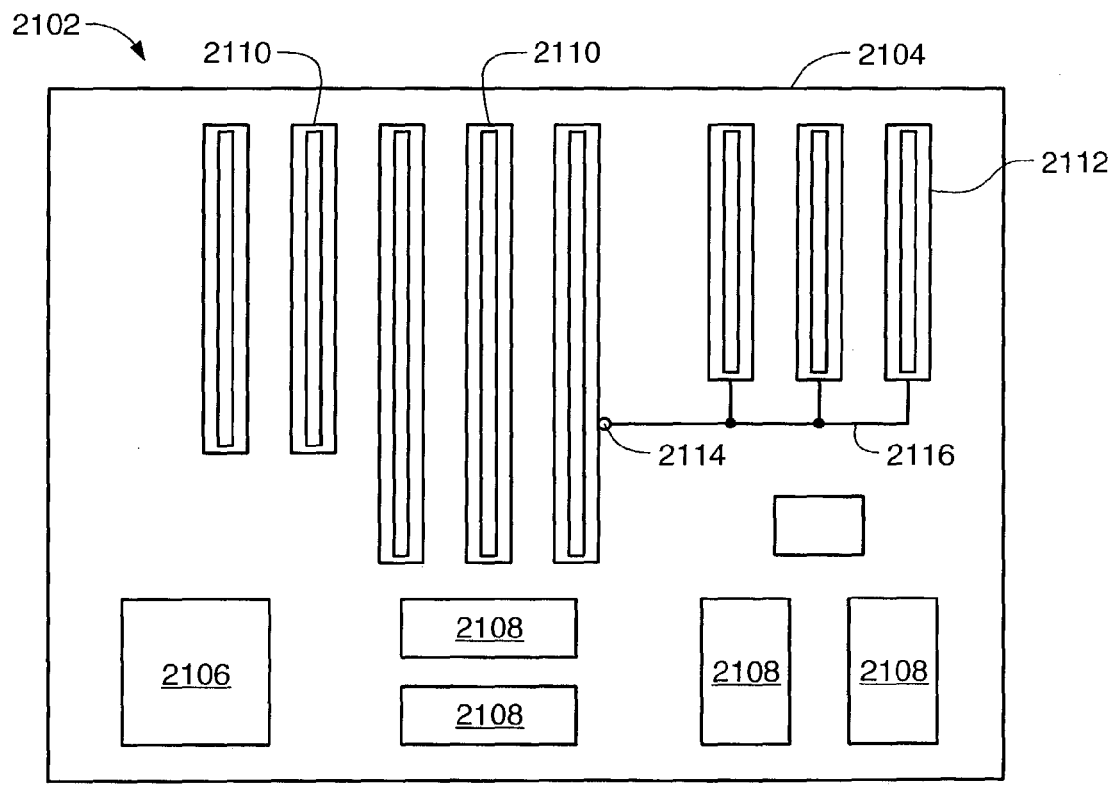
FIG. 13 depicts a motherboard within the scope of the current invention.
Figure 14:
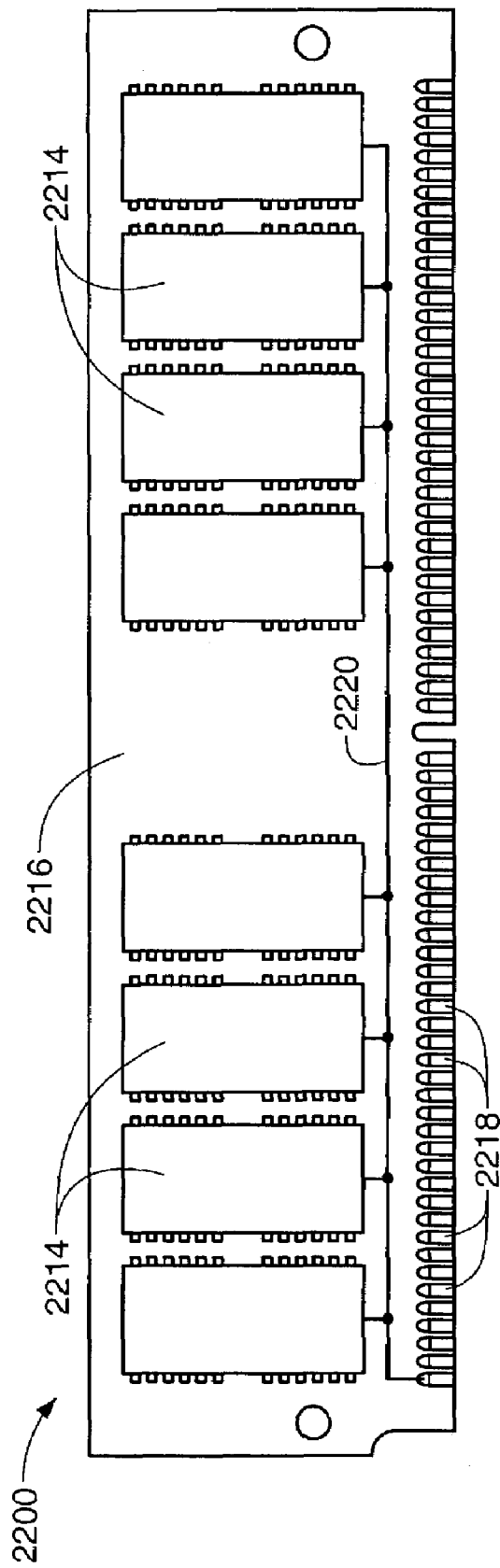
FIG. 14 depicts a module within the scope of the current invention.

Concerning error repair embodiments relevant to these circumstances, it follows that the repair signals sent to the chip 300 need not originate from a device devoted primarily to repairing, such as a TERADYNE® device. Maintaining the computer system example discussed above, it is preferred to allow the chip 300 within that computer system 304 to carry a voltage source sufficient to blow an anti-fuse 40. In many computer system configurations, the die is coupled to a motherboard that carries such a voltage. FIG. 13 illustrates a motherboard 2102 comprising a dielectric substrate 2104. The substrate 2104 is configured to accommodate various components including a central processing unit (CPU) 2106, various semiconductor devices 2108, input/output connections such as expansion slots 2110, which may include peripheral component interconnect (PCI) slots, industry standard architecture (ISA) slots, and accelerated graphics port (AGP) slots. The expansion slots 2110 allow for communication with various input or output devices, such as the ones discussed above in connection with FIG. 12. Also connected to the motherboard are memory sockets 2112 configured to receive memory devices such as the ones in FIG. 8A or 8B. At some point on the motherboard 2102 (perhaps at an expansion slot 2110) is a terminal 2114 configured to carry a twelve-volt signal. Such voltage may be used on the motherboard 2102 to accommodate an ADD converter, a disk drive, a universal serial bus (USB) connection, and/or flash memory. Accordingly, the motherboard 2102 also comprises conductive lines configured to provide that voltage where desired. Most of the conductive lines are not shown in FIG. 13 to avoid unduly complicating that figure. Such voltage may also be used for repair in exemplary embodiments in the current invention. FIG. 13 illustrates a conductive line 2116 extending from the terminal 2114 to the memory sockets 2112 to allow such repair. On-chip error repair is further facilitated by circuitry added to the memory device configured to fit in the socket of the motherboard. FIG. 14 illustrates a multi-chip module 2200. Like the multi-chip module 1612 in FIG. 8B, multi-chip module 2200 comprises a plurality of dice 2214 mounted onto a support surface such as a printed circuit board 2216. The dice 2214 may be linked by conductive traces 2220 in or on the printed circuit board 2216. At least some of these conductive traces 2220 connect with conductive contacts 2218 in one or more rows along at least one edge of the board 2216. Further, at least one of these conductive traces 2220 is configured to electrically communicate through a contact 2218 with a conductive line on the motherboard and hence carry the twelve-volt signal to the dice 2214. That contact 2218 could be what would be designated as a "no-connect" pin in prior art packages.

As a result, sufficient voltage is carried to the device via the motherboard to blow anti-fuses 40, thereby allowing for on-chip error repair, identification of failed redundant elements, and/or conveying other information via blown anti-fuses while a memory device is in the field and/or part of an electronic device such as a computer system. Moreover, as with the testing and software download stages discussed above, programming devices for purposes of error repair or other purposes may occur while the system is in a power management mode. Further, the results of the programming may be transmitted to an output device 312 of the computer system 304.

Thus, these embodiments concerning error test, recordation, and/or repair "in the field" further demonstrate that the current invention addresses all stages of die singulation, packaging, and incorporation with other electronics. These embodiments further demonstrate that the current invention addresses all sources of error test or repair signals, be they from a device devoted primarily to repair, devoted primarily to test, or merely capable of test and repair in addition to other functions. These embodiments also demonstrate that the current invention addresses any package or end-user application.

Accordingly, the invention is not limited except as stated in the claims.

What is claimed is:

1. A method of processing a semiconductor die, comprising:
   providing a semiconductor die;
   providing segmented redundancy using a portion of one of a redundant row or redundant column of memory cells on said semiconductor die, wherein a quantity of memory cells of the portion is less than a quantity of memory cells of the one of the redundant row or the redundant column of memory cells;
   testing memory on said semiconductor die, wherein testing includes simultaneously activating at least a plurality of rows or columns spanning at least a plurality of repair segments of the segmented redundancy; and
   storing on said semiconductor die at least one result of testing.

2. The method in claim 1, wherein storing comprises storing data relating to a failure of testing.

3. The method in claim 2, wherein testing comprises testing at least one redundant cell; and wherein storing comprises programming a programmable device associated with said at least one redundant cell.

4. The method in claim 2, wherein testing comprises testing at least one non-redundant cell; and wherein storing comprises storing an address of said at least one non-redundant cell in a register on said semiconductor die.

5. The method in claim 4, wherein storing comprises storing a row address.

6. The method in claim 5, wherein storing comprises storing a bit indicating said failure.

7. The method in claim 6, wherein storing comprises storing a column address.

8. The method in claim 1, wherein testing further comprises activating at least one row, wherein activating is free of dependency upon segmentation of said segmented redundancy.

9. The method in claim 1, wherein testing comprises activating every row in said segmented redundancy.

10. The method in claim 1, wherein storing comprises storing an address of any memory cell of said segmented redundancy having failed testing.

11. The method in claim 10, wherein storing comprises storing an address of every memory cell of said segmented redundancy having failed testing.

12. The method in claim 11, wherein storing comprises storing at most one address at any time.

13. The method in claim 12, wherein storing comprises storing an address of a latest memory cell of said segmented redundancy having failed testing.

14. The method in claim 1, further comprising determining whether repair is possible based on said at least one result of testing.

15. The method in claim 14, further comprising determining whether repair is needed based on said at least one result of testing.

16. The method in claim 15, further comprising conducting a first repair of said semiconductor die using a selection of at least a first segment, wherein said first repair is based on results of testing.

17. A method of processing a semiconductor die, comprising:
    testing memory on a semiconductor die including segmented redundancy using a portion of one of a redundant row or redundant column of memory cells on said semiconductor die, wherein a quantity of memory cells of the portion is less than a quantity of memory cells of the one of the redundant row or the redundant column of memory cells, wherein testing includes simultaneously activating at least a plurality of rows or columns spanning at least a plurality of repair segments of the segmented redundancy; and
    storing on said semiconductor die at least one result of testing.

18. The method in claim 17, wherein storing comprises storing data relating to a failure of testing.

19. The method in claim 18, wherein testing comprises testing at least one redundant cell; and wherein storing comprises programming a programmable device associated with said at least one redundant cell.

20. The method in claim 19, wherein testing comprises testing at least one non-redundant cell; and wherein storing comprises storing an address of said at least one non-redundant cell in a register on said semiconductor die.

* * * * *